United States Patent [19]
Benton et al.

[11] Patent Number: 5,961,738
[45] Date of Patent: Oct. 5, 1999

[54] SOLAR ARRAY FOR SATELLITE VEHICLES

[75] Inventors: Max D. Benton, Goleta; P. Alan Jones, Santa Barbara; Brian Spence, Solvang; Earl McCutcheon, Santa Ynez; Carl Devillier, Santa Barbara, all of Calif.

[73] Assignee: AEC-Able Engineering Co., Inc., Goleta, Calif.

[21] Appl. No.: 08/903,123

[22] Filed: Jul. 30, 1997

[51] Int. Cl.⁶ .................................................. H01L 31/00
[52] U.S. Cl. ........................... 136/245; 136/251; 136/292
[58] Field of Search .................... 136/245, 251, 136/292

[56] References Cited

U.S. PATENT DOCUMENTS

| | | | |
|---|---|---|---|
| 3,973,745 | 8/1976 | Coltrin et al. | 136/245 |
| 5,131,955 | 7/1992 | Stern et al. | 136/245 |

*Primary Examiner*—Mark Chapman

[57] ABSTRACT

A solar array with a blanket having solar cells incorporated in modules that can readily be removed, replaced, and accordion-folded to a stowed condition. A scissors array having tracks in which scissors linkages are slidingly fitted enables the array to be stowed or deployed from a container in which the module are interleaved with soft, compressed leaves that protect the blanket from inertial forces during handling and launching.

14 Claims, 7 Drawing Sheets

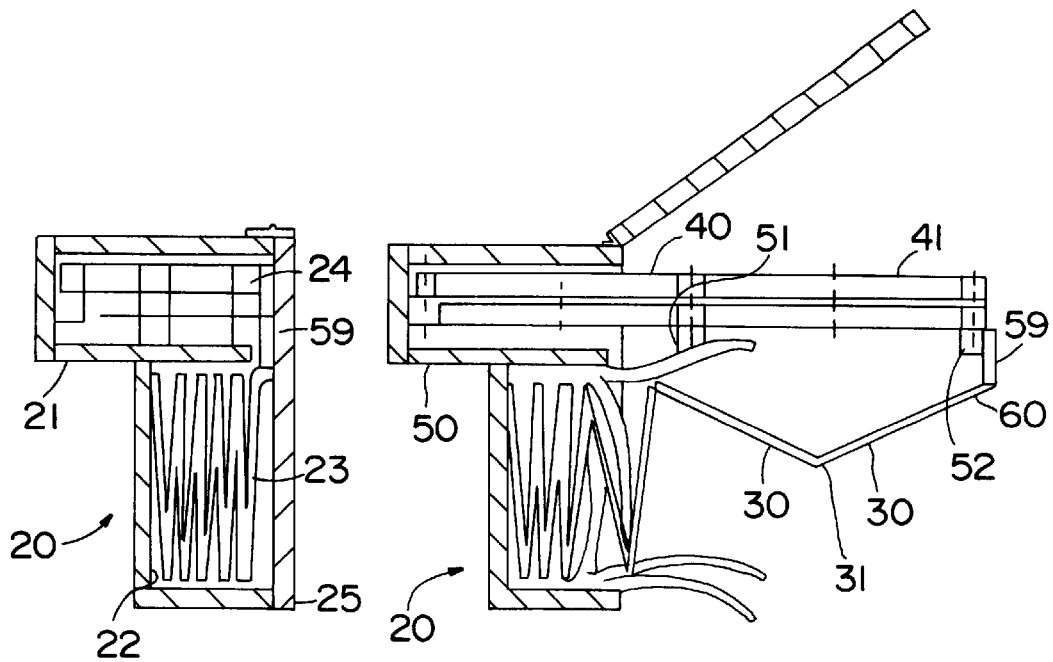
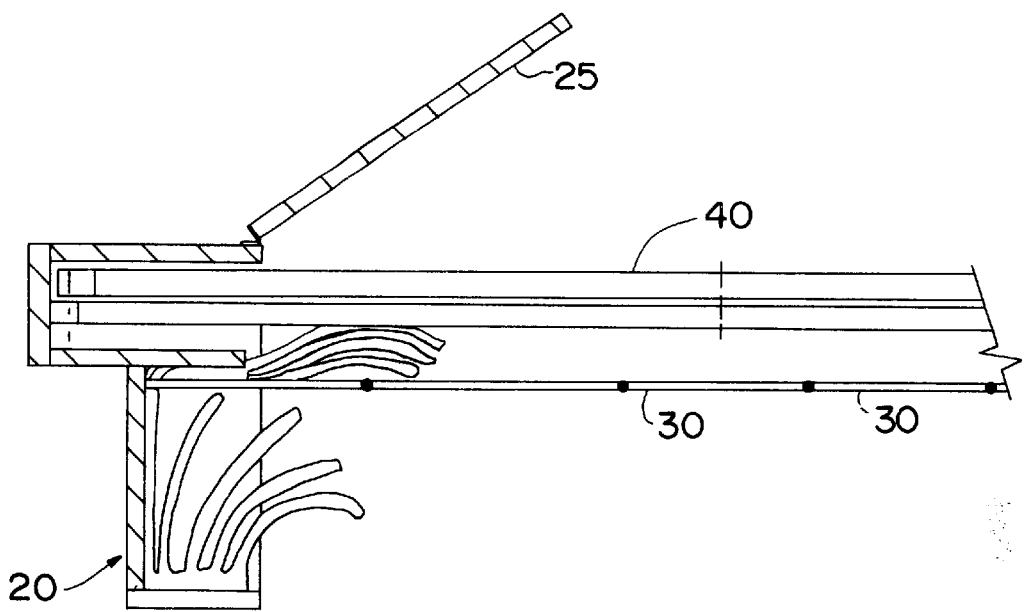

SOLAR ARRAY FOR SATELLITE VEHICLES

FIELD OF THE INVENTION

A solar array to power satellite vehicles which is storable in a small container for shipment and launch, and that is deployed when aloft to expose a large surface area of solar collectors.

BACKGROUND OF THE INVENTION

Deployable solar arrays are typically contained in a small envelope when their space vehicle is launched. They are later deployed to an extended configuration to expose areas of solar collectors. Examples of such arrays are shown in the following United States patents:

Avilov—U.S. Pat. No. 3,460,992

Harvey et al—U.S Pat. No. 5,296,044

Everman et al—U.S. Pat. No. 5,487,791

A review of these patents will disclose remarkable efforts to reduce the weight and increase the reliability of these arrays. Cost, while important, has been and still is subordinate zoo reliability. The failure of an array to deploy and to survive for its full design life can result in loss of value of the entire craft and its payload. The cost of the craft and its payload is many times that of the array, especially when the payload is unique and employed for very advanced applications.

Because of this, and because of the relatively small number of vehicles involved, the design and manufacture of solar panels and their supporting structure has tended toward the complex, familiar, and costly. They have been carefully and slowly built, almost in a "handicraft" sense.

However, with the advent of space-based communication systems, the market for satellites has greatly enlarged. The cost of the payloads, while still considerable, has decreased. Expenses which are tolerable for a few very high value vehicles become unacceptable when the production count will run into the hundreds.

The demand for such a large number of arrays threatens to outstrip the capacity of existing manufacturing plants that were sufficient for the previous slow-paced demand. Multiplying plant capacity can permit faster production schedules, provided that additional skilled personnel can be found, and provided that the additional capital is available. Still the arrays would remain at least as costly.

Also, the problems of producibility remain. Existing constructions are built very painstakingly, because if one part is imperfectly produced, a large part of the entire array often must be scrapped or reworked at considerable cost. This risk and the unfavorable consequences which inevitably occur, has reduced the yield of these arrays.

It is an object of this invention to provide a solar panel which can be efficiently manufactured to high standards, and should some part of it be unsuitable, can be quickly and easily repaired or replaced. Thus the entire assembly need no longer be hostage to the acceptability of every part. Instead, all parts will be individually and readily replaceable.

With this invention, it appears likely that an array which formerly required a few months to build, can be built in a day.

However, manufacturing problems are not the only ones solved by this invention. In order to build a truly lightweight structure, the materials of construction must themselves be lightweight, and will often lack much structural strength while in a gravitational field, or in the fields of force that exist at launch or in transporting it to the site where it will be installed. To overcome this, conventional arrays simply provided more strength with more structure, and more cost.

These arrays must be stored in such a way that they can be placed in a container which can be handled on the ground without extreme care, and which will protect the array from the large launching forces. Then, when the craft is in orbit, the container must permit the delicate solar blanket controllably to be deployed from the craft and be fully protected during its removal from the container and extension to the deployed configuration. It is an object of this invention to provide such a container.

This still does not exhaust the problems of most existing arrays. Their tendency is to deploy the structure and lock it physically into a rigid structure. While there are no net gravitational forces on it while in orbit, a solar array is subject to substantial internal forces, especially to those which occur during the time while the craft leaves the shadow of the earth and comes into the sunlight. All too often, the different local expansions of material, and stacked-up dimensional tolerances, result in a hard physical snap as relative dimensions of the various parts change. While a solid lock that rigidifies the structure will assure that the structure will remain intact and deployed when it snaps, such forces can be damaging to the delicate parts of an array.

In the course of simplifying the array of this invention, the applicants have taken a different approach to cause and to assure deployment, which eliminates risk of the snapping action which is experienced in much of the prior art.

The consequence of these improvements is to increase the productivity and yield of solar arrays while still providing excellent reliability, at a significantly lower cost.

BRIEF DESCRIPTION OF THE INVENTION

A solar array according to this invention includes three integrated components. The first is a storage container which holds and protects the delicate solar array blanket and its supporting mechanism while it is being shipped, while it is being installed, and while it is being deployed.

According to a feature of this invention, the container includes flexible leaves rooted to the container that are interleaved with pleated solar power assemblies to shield them from damage by forces which are applied to the container during shipment and launch.

The second component is a scissors-type deployment mechanism adapted to retract with an attached solar blanket for storage, and to unfold and extend the blanket for deployment.

According to a feature of this invention, the deployment mechanism is spring loaded to its deployed condition by bringing together ends of a scissors linkage. Retraction of the linkage is done in opposition to a spring which stores energy for deployment. Importantly, there are no rigid locks in the system, so that it can yield to accommodate the effects of different expansions occasioned by localized heating of different parts, thereby to avoid the snapping action caused by thermal differences and by tolerance build-up in systems that are rigid when deployed.

The third component is a solar array blanket of significant economy of cost, construction, rework, and repair. It is particularly able to accommodate the delicate and fragile solar power modules which are formed with solar cells mounted to a light flexible backplane.

According to a feature of this invention, solar power modules comprising a backplane and an array of solar cells are joined at abutting edges by a stiff spine segment with a live self-hinge joined to a next-in line spine segment so the blanket can be folded, accordion style, bent at the hinges. Depending on the type of cell which is used, a cover glass will sometimes be applied to the cells on the opposite side from the backplane.

According to a preferred but optional feature of the invention, the spine segment includes compressive, binder type plates which are brought toward each other to hold edges of adjacent modules, and also to compress dot-type electrical interconnects together, thus to make readily detachable connectors for the circuitry within the modules.

In use, the free end of the solar array blanket when extended is connected to the deployment mechanism by an offset member to space them apart from the deployment mechanism.

For storage, the deployment mechanism is separated from the blanket and the blanket is folded, accordion style, with a leaf of the container placed in each fold. The scissors linkage, already mounted to the container, is compressed and is then attached to the free end of the blanket. The cover of the container is thereafter closed to contain and protect the stored solar array. When installed in the craft, conductive connections from the blanket will preferably be made to the container, and from the container to external circuity.

The above and other features of this invention will be fully appreciated from the following detailed description and the accompanying drawings, in which:

BRIEF DESCRIPTION OF THE DRAWINGS

FIG. 4 is a cross-section taken at line 4—4 in FIG. 1;

FIG. 5 is a cross-section similar to FIG. 4, with the solar array partially deployed;

FIG. 6 is a partial cross-section similar to FIG. 4, with the solar array fully deployed;

DETAILED DESCRIPTION OF THE INVENTION

Figure 1:
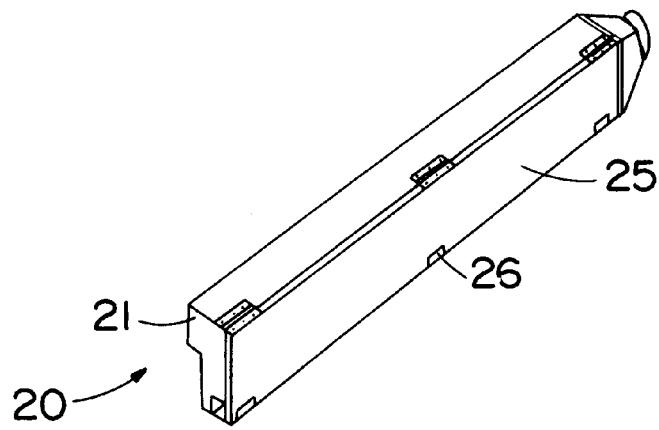
FIG. 1 is a perspective view of the container containing the solar array blanket and the deployment mechanism of this invention, the solar array being in its stored configurations.
Figure 2:
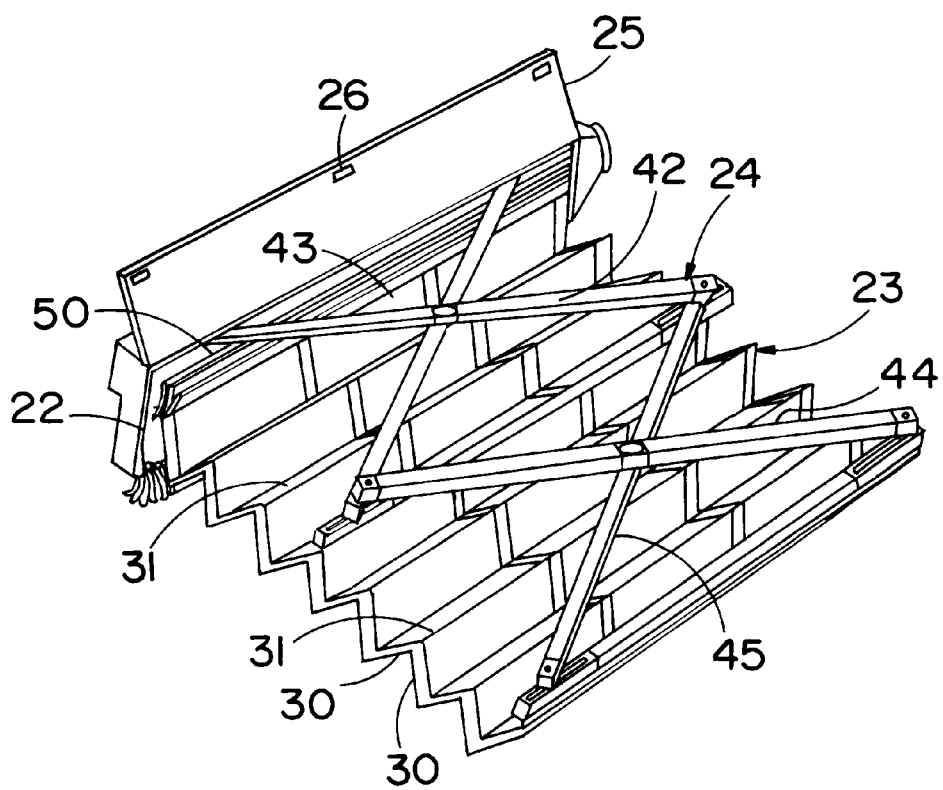
FIG. 2 is a perspective view showing the container of FIG. 1 with the solar array blanket and deployment mechanism partially deployed.
Figure 3:
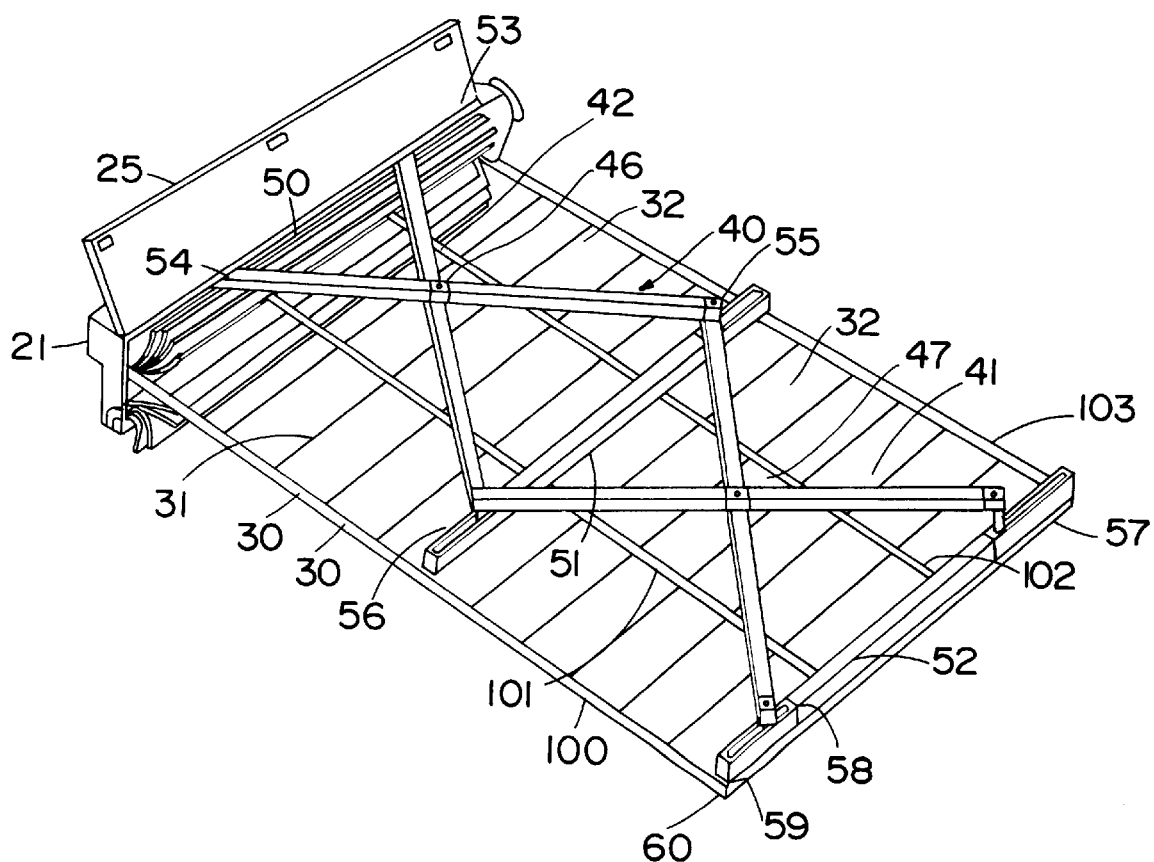
FIG. 3 is a perspective view similar to FIG. 2, with the solar array fully deployed.

FIGS. 1–3 provide an overview of the invention. Container 20 is shown in FIG. 1. It includes a receptacle 21 having a cavity 22 to receive a retracted solar array blanket 23 and a retracted deployment mechanism 24. A hinged lid 25 closes the receptacle, with a latch 26. When the lid is closed and latched, the enclosed solar array blanket will be shielded from directly applied forces.

FIGS. 2 and 3 show the solar panel partly deployed and fully deployed, respectively. In FIG. 2, the blanket 23 is shown with its solar power assemblies 30 partly unfolded from one another at fold edges 31. As will later be seen, the solar panel modules 32 which makeup the solar power assemblies do not themselves fold. The accordion (pleating) folding action takes place in hinges that are part of spine members yet to be described.

Deployment mechanism 24 includes one or more scissor linkages. In the example, two scissor linkages 40, 41 are shown. Scissor arms 42, 43 form linkage 40, and scissor arms 44, 45 form linkage 41.

Bearings 46, 47 join the pairs of scissor arms. Preferably these are low friction bearings and may if desired have provisions for dampening abrupt or excessively rapid relative rotation of the scissor arms.

Transverse tracks 50, 51, and 52 receive respective pairs of rollers 53, 54; 55, 56; and 57, 58. Track 50 is mounted to the container. Track 52 includes an offset flange 59 which is connected to the free edge 60 of the blanket. As will later be seen, the rollers in the pairs of rollers are spring-biased toward each other, thereby biasing the panel toward the deployed condition of FIG. 3. The panel is packed into its stored condition in opposition to this spring bias, so that the stored assembly contains the energy required for its deployment.

As will later be seen, the solar array blanket is quite delicate, in large part because of the requirement for lightness of weight. The solar power assemblies 30 should not be subjected to deforming stresses, or to contact with one another. In storage they must be held very closely, and accurately positioned, and still they must be free to be removed without wear or damage while they are being deployed.

These objectives are met with the device shown in FIGS. 4–6. Sets 65, 66 of adjacent leaves are rooted to oppositely facing surfaces 67,68 of the container in the cavity. Individual leaves such as leaves 69,70 in both sets of leaves are spaced apart by spacings 71 to receive a pair of adjacent modules 72, 73, while an opposing leaf 74 fits between them. All modules are similarly supported.

The leaves are made from a soft lightweight foam, such as a polyamide foam which is covered with Tefzel. These materials are resistant to the damaging effects of space radiation, and provide to the modules while in storage, retention against inertial reaction loads, and protection from rubbing against one another.

As shown in FIGS. 4–6, adjacent modules are interleaved with the flexible leaves, and can be packed tightly as shown in FIG. 4. This is a firmly packed group which will respond as a solid body to inertial forces. When the lid is opened, and the deployment mechanism is extended, the solar power assemblies will be drawn sequentially from the container. The leaves are suitably slick and flexible so that they will flex to permit the assemblies to be drawn past them, and they will do no harm to the surfaces of the solar power assemblies as they pass along their surfaces. As shown in FIG. 6, the leaves remain in the container when the solar array is fully deployed.

The solar array blanket 23 will now be described in detail. It includes solar power assemblies 30 that are made up of solar power modules 32. The preferred module 32 comprises a backplane 80 which contains circuitry 81 that connects to terminals of solar cells 82 that are applied to it. Such circuitry is carried by the backplane, often being a deposited conductive layer. This circuitry terminates at tabs 84,85 at each end of the solar power modules. Each tab includes a pair of terminals 86, 87 to provide for attachment to additional circuitry. These terminals and the circuitry carried by the backplane serve to connect the cells respective to its module into a solar power assembly as will be further described.

In this embodiment of solar power module, a cover sheet 88 overlays the cells. The backplane, cells and cover sheet are firmly sandwiched together. The resulting solar power modules are next assembled, side-by-side, to form solar power assemblies 30. The mode of physically joining the solar modules and the solar power assemblies is with the use of spine segments which provide for support against bending of the modules around an axis normal to the axis of extension, and which also provide for bending between assemblies so the blanket can be folded (pleated).

Stresses on the solar panel modules, especially folding, inplane shear, or bending stresses, must be avoided. These modules are thin and delicate. It is an object of this invention to support them adequately while in storage, while being deployed, and while in a force field, with minimum structure and minimum structural weight. As previously said, this construction is intended to be readily assembled and disassembled for repair and replacement of solar power modules and solar power assemblies.

For this purpose, when a plurality of solar power modules are placed side by side to form a solar power assembly, a plurality of spine systems 100, 101, 102 and 103 is provided to hold them together. Should only a single solar power module form the solar power assembly, then only two spines, one at each longitudinal edge, will be used.

In FIG. 3, there are four spine systems, because each assembly contains three modules. There may of course be more or fewer modules. Spine systems 100 and 103 are formed at the edges of the blanket, and spine systems 101 and 102 are formed between adjacent modules. All spine systems are connected to the transverse track 50 on the container, and to the offset flange 59 on track 52. None is connected to track 51.

The spine systems are made up of spine segments. Because they are all structurally identical, only spine segment 105 will be described in detail. It is shown in FIGS. 8–11.

The spine segments are compressive types, much like a loose leaf compressive binder. Pressure plate 106 (FIG. 8) includes a planar portion 107 with weight-lightening cut-outs 108. An integral hinge pad 109 includes a pair of fastener ports 110, 111 and a hinge 112. The hinge is a region of reduced thickness that permits the hinge pad to rotate around the hinge. It is a live, self hinge.

At its other end, pressure plate 106 includes a pad 113 with a pair of fastener pins 115, 116 which will fit into fastener ports such as port 110 and 111 in a hinge pad on the next-in-line spine segment. In this way, next-in-line spine segments will be joined to each other by hinges so the blanket can be folded at the edges of the modules.

Pressure plate 106 also includes fastener ports 120, 121, 122, 123 to receive fastener pins 125, 126, 127, 128 which project from a second pressure plate 130 to form a fastener holding the plates together.

Pressure plate 130 is flat, with weight-lightening cut-outs 131, 132. Its fastener pins are aligned with ports 120–123, so that when the plates are pressed together, the pins will be retained in the ports and the plates will hold the modules firmly sandwiched between them. For this purpose, the edges of solar panel modules 135 and 136 (FIG. 11) are perforated by holes 137, 138, 139, 140 which register in matching pairs, so that when the pressure plates are brought against them they are firmly held against slipping relative to each other. The spine segments thereby structurally support the modules. If desired, supplementary fastening means such as nuts could be applied to the fastener pins, but with a properly close fit of the pins in the ports, it should not be necessary.

Tabs 145, 146 from modules 135 and 136 are folded over one another, atop a central flat region 147 on pressure plate 130. Each of these tabs includes a pair of ports 148, 149 which are fitted over pins 150, 151 on plate 130. They are then pressed together by pressure plate 155, which also has ports 156, 157. Plate 155 is curved so that when it is pushed onto the pins 150 and 151, it springily responds to exert a prevailing compressive force on the tabs. The dimensions of the pins and ports are close enough that the plate is self-retaining on the pins, although fastener means such as nuts could be used if desired.

The tabs include circuit connection means in connection with the circuitry (schematically shown) in the back planes. Preferably this connection means is compressive, and adapted for easy connection and disconnection. The well-known "gold dot" is especially well-suited for this purpose. It is a dot of gold with significant thickness. When two of these dots are pressed together, a good electrical connection is made. The dots are not fully cold-welded, so they can readily be pulled apart. This is an easily assembled electrical connection. Dots 160, 161 are shown on tab 145. Dots 162, 163 are shown on tab 146. The dots on one tab at one end of a module are on the opposite side from the tab at the other end.

The modules are assembled into a solar power assembly of two or more modules, edge to edge as shown. Then the assemblies are joined to form the blanket by joining adjacent hinge tabs. This forms the spines. One of the edge spines, for example system 100 will be provided with circuitry that interconnects the connections at the end tabs of each of the assemblies to conduct current to the container and thus to user devices.

It will now be seen that the modules will be supported by the spines, and that the spines will permit the blanket to be folded at the edges of the assemblies. The blanket is lightweight, and in the event of failure of any part of it, especially of the modules, that part can readily be removed and replaced.

Figure 12:
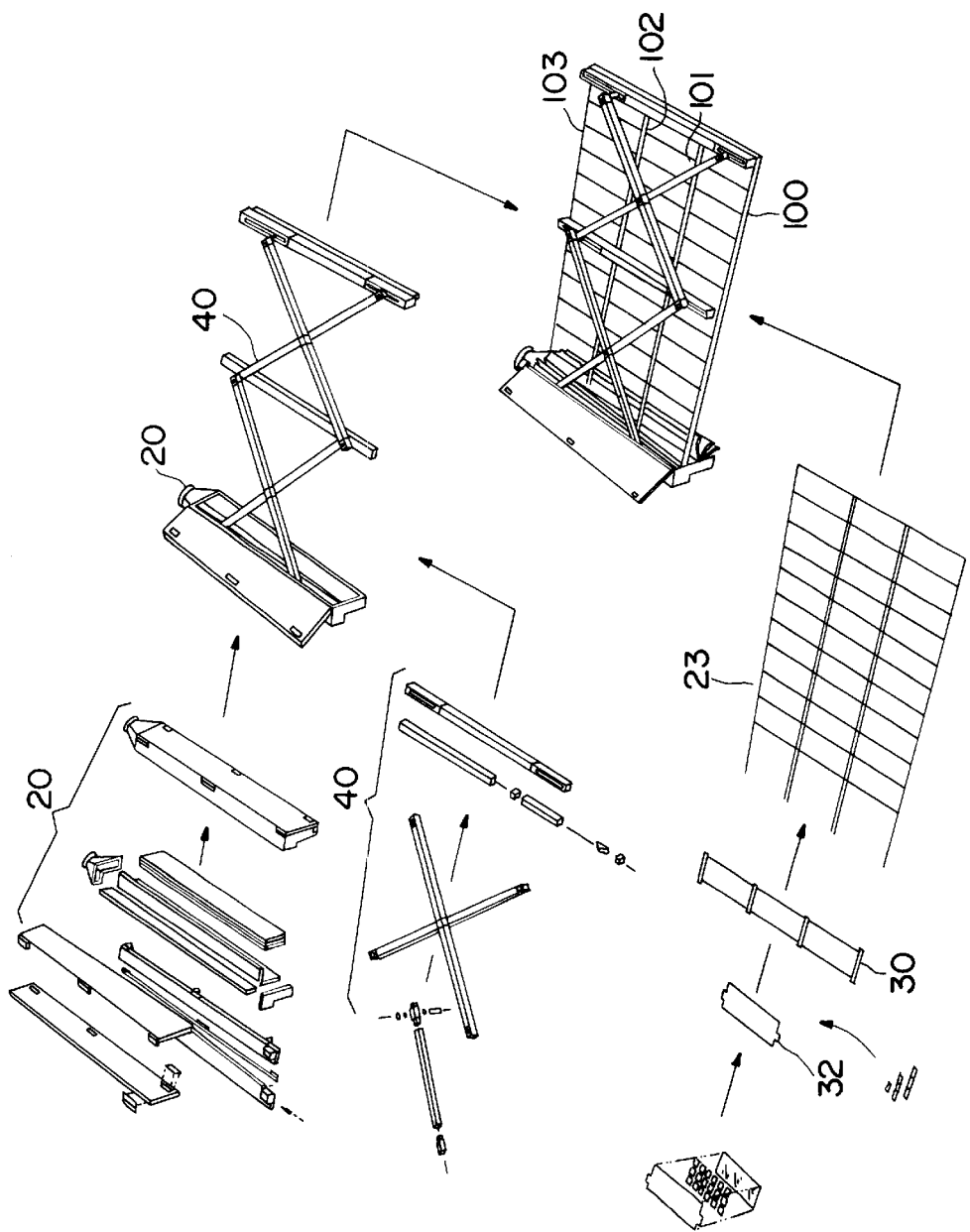
FIG. 12 is a manufacturing flow chart showing the assembly of this device.

FIG. 12 shows the assembly flow-path to build the array of this invention.

Figure 7:
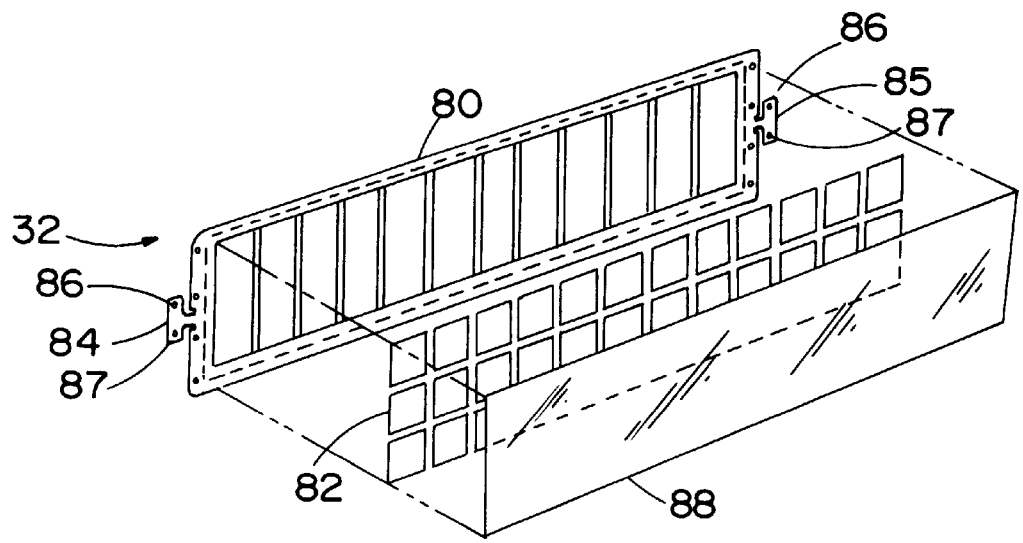
FIG. 7 is a schematic exploded showing of a solar power module according to this invention.
Figure 8:
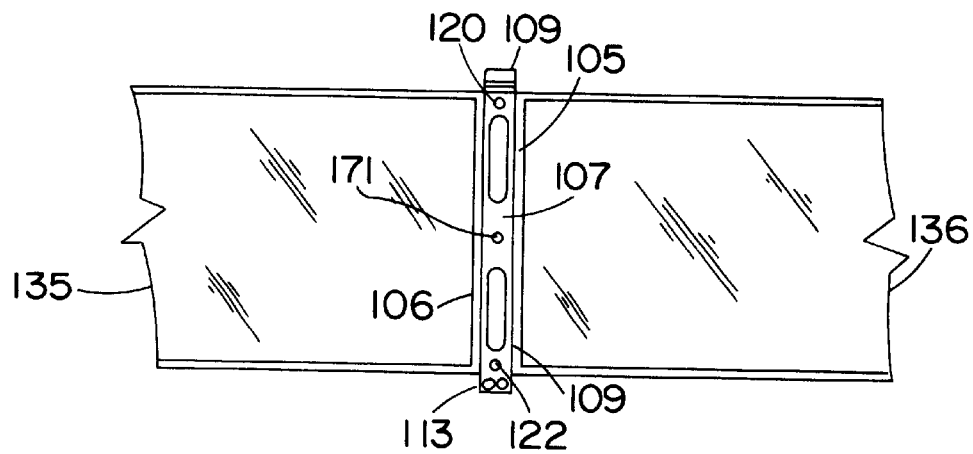
FIG. 8 is a fragmentary plan view showing a spine according to the invention.
Figure 9:
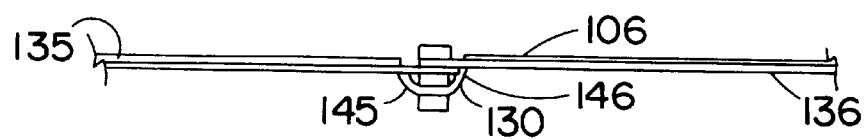
FIG. 9 is a bottom view of FIG. 8.
Figure 10:
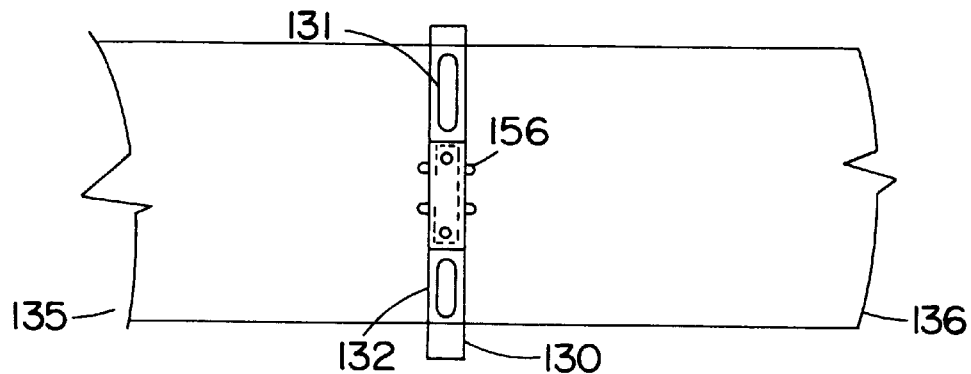
FIG. 10 is a rear view of FIG. 8.
Figure 11:
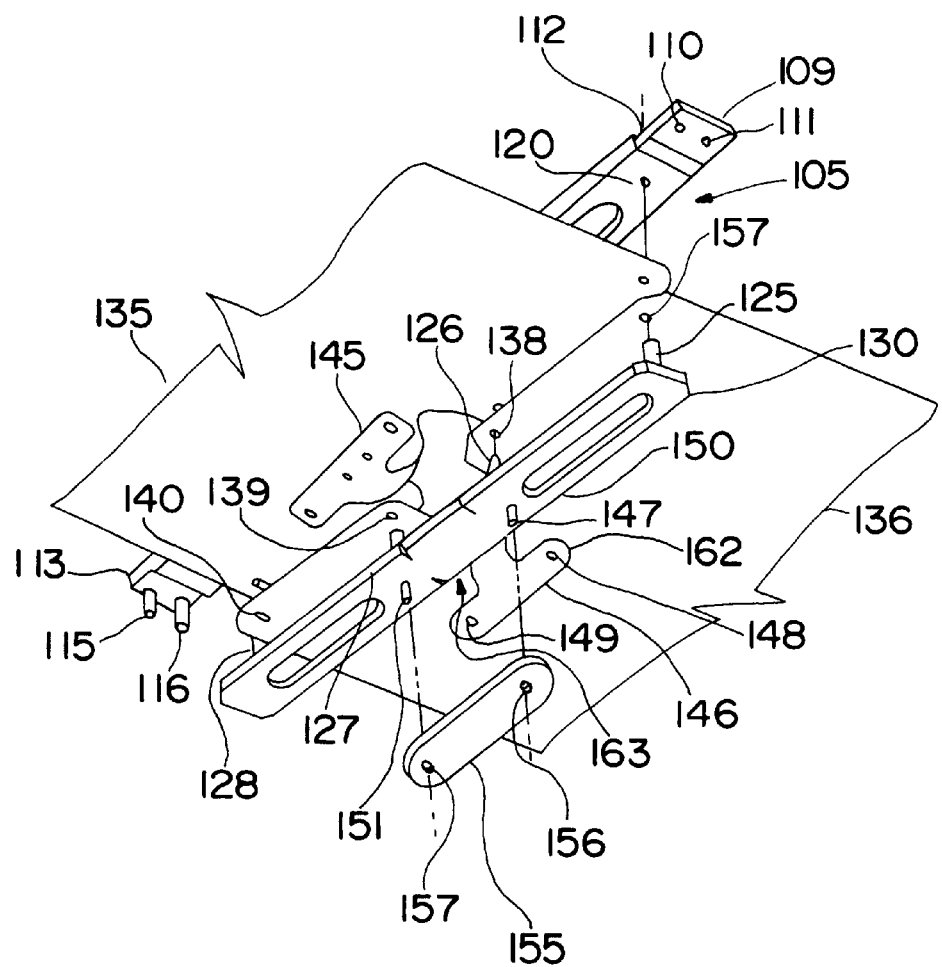
FIG. 11 is an exploded view of a spine.

This invention is not sensitive to the type of solar cell which is used in its solar power modules. Any type of solar cell can be used. The example shown in FIG. 7 is presently preferred for its convenience of replacement and in construction. A plurality of smaller cells is more amenable to replacement of faulty single cells than larger single cells, for example.

It will be noted in FIG. 7 that a cover glass 88 is provided which covers all of the cells and sandwiches them between itself and backplane 80.

Figure 13:
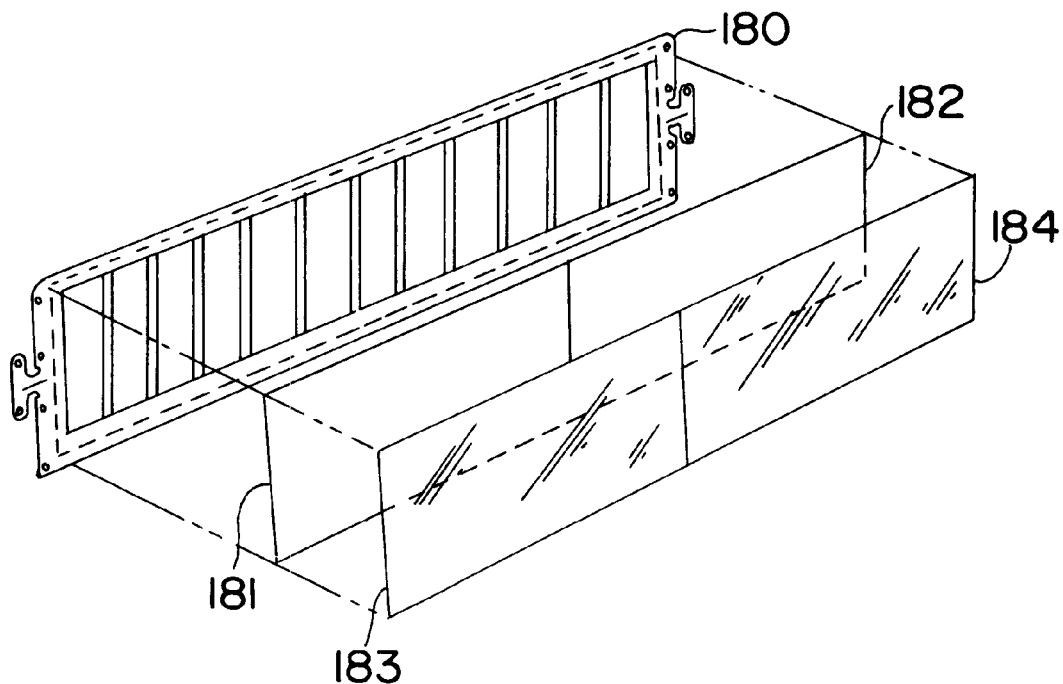
FIG. 13 is a schematic exploded view of another useful solar power module.

In FIG. 13 a variation is shown which includes a backplane 180 similar to backplane 80. Two larger solar cells 181, 182, which may be of a different type than cells 82 in FIG. 7, are sandwiched between a cover glass that has two segments 183, 184. This illustrates the fact that the cover glass need not be made from a single piece, provided that the backplane has suitable strength and thickness.

Figure 14:
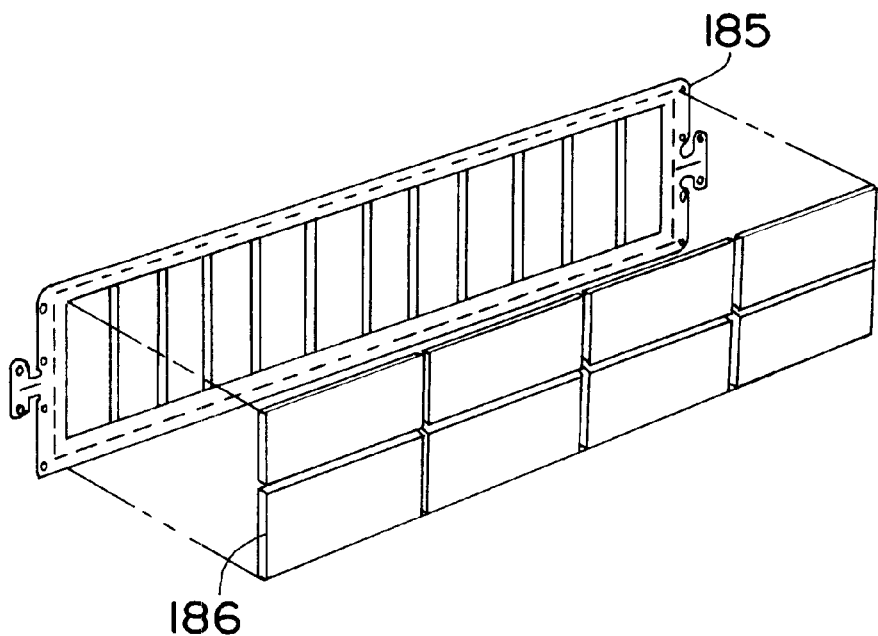
FIG. 14 is schematic exploded view of yet another useful solar power module.

In FIG. 14, another variation of solar power assembly is shown in which a backplane 185 similar to backplane 80 faces a group of solar cells 186 which are formed on a transparent substrate, thereby forming their own cover glass. In this embodiment a separate cover glass is not provided.

Attention is called to the fact that the deployment mechanism is not rigidly locked when deployed. Instead it is maintained deployed by a spring system that exerts a prevailing force which can be overcome. Then, when stresses differ at various parts of the deployed structure, the structure need not undergo the snapping action which can occur in a rigid structure while it passes into and out of the earth's shadows. The unfavorable consequences of this and of tolerance build-up are thereby obviated.

This invention discloses a readily manufactured solar array made of simple parts which can be assembled and repaired at low cost. It is scalable to provide for varying needs, provides for a high product yield, and resists inertial damaging forces.

This invention is not to be limited by the embodiments shown in the drawings and described in the description, which are given by way of example and not of limitations, but only in accordance with the scope of the appended claims.

We claim:

1. A solar array comprising:
    a solar array blanket comprising a plurality of solar power modules, each said module comprising a backplane bounded by a pair of parallel lateral edges and a pair of longitudinal edges, a solar cell laid on said backplane, said backplane including circuitry for incorporating said solar cell into a circuit, said backplane further including a pair of tabs carrying circuit connectors for said circuitry, one of said tabs extending from each longitudinal edge; a spine segment attached to each longitudinal edge, each said spine segment comprising a pair of rigid compression plates between which a longitudinal edge of at least one backplane is sandwiched, fasteners passing through holes in said backplane to hold said backplane against twisting or slipping relative to the spine segment, said spine segments at the outer longitudinal edges of said solar array blanket holding the edge of only one backplane, while a spine member between a pair of solar power modules holds an edge of two backplanes, and a tab compression plate overlaying a pair of adjacent tabs and holding them compressively between it and one of said compression plates, a hinge on one of said tab compression plates adapted to be connected to an aligned spine segment to form a spine that permits folding motion between two backplanes that are aligned in a longitudinal direction, and circuitry extending along at least one spine conductively interconnecting the circuitry of solar power modules which are adjacent along their lateral edges:
    deployment structure comprising a plurality of pairs of scissor arms joined in pairs at a respective central bearing, a plurality of lateral tracks, said lateral tracks being parallel to said lateral edges of the solar power modules said scissor arms having ends laterally slidable in said tracks, a spring in at least one of said tracks biasing its respective said ends toward one another, thereby tending to deploy said deployment means, one of said tracks including an offset flange to which at least one of said spines is connected; and
    a container for containing said solar blanket and deployment structure when in their stored configuration, said container forming a cavity, a pair of sets of soft flexible and compressible leaves rooted in said container, so disposed and arranged as to interleaf between adjacent solar power modules when the array is retracted with them in an accordion-fold pattern forming a continuous body to protect them from inertial forces, said leaves being soft and flexible and able to bend to release said modules when they are withdrawn from the cavity, and a closure to close said cavity and house the stored solar array.

2. A solar array according to claim 1 in which one of said lateral edges of said solar array blanket is hinged to said container inside said cavity whereby to anchor said blanket when it is deployed.

3. A solar array according to claim 1 in which a plurality of solar power modules are joined to each other at their longitudinal edges by spines to form a plurality of solar power assemblies hinge-joined at their lateral edges.

4. A solar array according to claim 3 in which said fasteners each includes a plurality of pins and ports on each said spine segment, and in which said backplane includes holes through which said pins pass from one of said plates into a port in a compression plate on the other side of the respective backplane to hold said longitudinal edges compressed, and against in-plane rotation.

5. A solar array according to claim 4 in which said hinge is a flexible portion of said spine segments.

6. A solar array according to claim 1 in which a plurality of solar power modules are joined at their longitudinal edges to form solar power assemblies, with a said spine at all longitudinal edges.

7. In combination:
    a solar array blanket comprising a plurality of planar solar power modules each having parallel longitudinal and lateral edges, and a hinge joining adjacent lateral edges so that the blanket can be folded, accordion style, to a stored configuration; and
    a container to contain said solar blanket in a stored configuration, with said solar power modules in their folded condition, said container including a pair of sets of soft flexible and compressible fingers fixed to the container spaced apart from and facing each other, whereby to interleaf between adjacent modules to prevent them from abutting one another, and forming a continuous body to protect the modules from inertial forces, said fingers being deflectable to enable said interleaving and to permit said modules to be withdrawn from the container, said container including a closure to close the cavity when the solar blanket is stored therein.

8. A combination according to claim 7 in which said fingers are formed as parts of respective unitary and continuous foam structures, and are adapted to compress and to bend to protect and accommodate said modules.

9. A combination according to claim 7 in which one of said lateral edges of said solar array blanket is hinged to said container inside said cavity whereby to anchor said blanket when it is deployed.

10. A solar array blanket comprising a plurality of solar power modules, each said module comprising a backplane bounded by a pair of parallel lateral edges and a pair of longitudinal edges, solar cell laid on said backplane, said backplane including circuitry for incorporating said a solar cell into a circuit, said backplane further including a pair of tabs carrying circuit connectors for said circuitry, one of said tabs extending from each longitudinal edge; a spine segment attached to each longitudinal edge, each said spine segment comprising a pair of rigid compression plates between which a longitudinal edge of at least one backplane is sandwiched, fasteners passing through holes in said backplane to hold said backplane against twisting or slipping relative to the spine segment, said spine segments at the outer longitudinal edges of said solar array blanket holding the edge of only one backplane, while a spine member between a pair of solar power modules holds an edge of two backplanes, and a tab compression plate overlaying a pair of adjacent tabs and holding them compressively between it and one of said compression plates, a hinge on one of said tab compression plates adapted to be connected to an aligned spine segment to form a spine that permits folding motion between two backplanes that are aligned in a longitudinal direction, and circuitry extending along at least one spine conductively interconnecting the circuitry of solar power modules which are adjacent along their lateral edges.

11. A solar blanket according to claim 10 in which said connectors provide electrical conductivity between adjacent modules.

12. A solar blanket according to claim 10 in which a plurality of solar power modules are joined to each other at their longitudinal edges to form a plurality of solar power assemblies hinge-joined at their lateral edges.

13. A solar blanket according to claim 11 in which each said spine segment includes a plurality of pins and ports, and in which said backplane include holes through which said pins pass from one of said plates into a port in a compression plate on the other side of the respective backplane to hold said longitudinal edges compressed, and against in-plane rotation.

14. A solar blanket according to claim 12 in which said hinge is a flexible portion of said spine segment.

* * * * *